(12) United States Patent
Chhabra et al.

(10) Patent No.: US 10,594,314 B2
(45) Date of Patent: Mar. 17, 2020

(54) MITIGATION OF SIMULTANEOUS SWITCHING OUTPUT EFFECTS

(71) Applicant: Seagate Technology LLC, Cupertino, CA (US)

(72) Inventors: Nitin Kumar Chhabra, Maharashtra (IN); Hemant Kalidas Wadhavankar, Maharashtra (IN); Abhijit Anilkumar Jawkar, Maharashtra (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 149 days.

(21) Appl. No.: 15/785,547

(22) Filed: Oct. 17, 2017

(65) Prior Publication Data

US 2019/0115912 A1    Apr. 18, 2019

(51) Int. Cl.
| | |
|---|---|
| H03K 17/16 | (2006.01) |
| H03K 17/00 | (2006.01) |
| G01R 31/317 | (2006.01) |
| H03K 17/28 | (2006.01) |
| G11C 29/00 | (2006.01) |
| G06F 13/40 | (2006.01) |

(52) U.S. Cl.
CPC ....... *H03K 17/16* (2013.01); *G01R 31/31725* (2013.01); *G11C 29/00* (2013.01); *H03K 17/005* (2013.01); *H03K 17/28* (2013.01); *G06F 13/4022* (2013.01)

(58) Field of Classification Search
CPC ............................ H03K 17/16; H03K 17/28
See application file for complete search history.

(56) References Cited

U.S. PATENT DOCUMENTS

| | | |
|---|---|---|
| 6,307,414 B1 | 10/2001 | Hoff |
| 6,788,098 B1 | 9/2004 | Alani et al. |
| 6,971,040 B2 | 11/2005 | Volk |
| 6,998,892 B1 | 2/2006 | Nguyen et al. |
| 7,135,895 B2 | 11/2006 | Komura |
| 7,205,815 B2 | 4/2007 | Park |
| 7,486,702 B1 | 2/2009 | Yang |
| 7,589,557 B1 | 9/2009 | Bergendahl et al. |
| 7,788,620 B1 | 8/2010 | Xue et al. |
| 7,895,555 B1 | 2/2011 | West et al. |
| 8,086,435 B1 | 12/2011 | Alexander |
| 8,234,611 B2 | 7/2012 | Breiland et al. |
| 8,412,497 B1 | 4/2013 | Alexander |
| 9,263,151 B2 | 2/2016 | Xanthopoulos et al. |
| 2004/0153850 A1 | 8/2004 | Schoenborn et al. |

*Primary Examiner* — Jack Chiang
*Assistant Examiner* — Aric Lin
(74) *Attorney, Agent, or Firm* — Westman, Champlin & Koehler, P.A.

(57) ABSTRACT

Method of reducing simultaneous switching output (SSO) impact in a system through the use of signal integrity/power integrity (SI/PI) simulations for each channel in the system includes calculating a worst case scenario current for a channel of the system, and calculating a worst case channel skew for a channel of the system. Based on the worst case scenario current and the worst case channel skew, a switching current is determined for the system.

11 Claims, 7 Drawing Sheets

MITIGATION OF SIMULTANEOUS SWITCHING OUTPUT EFFECTS

SUMMARY

In one embodiment, a method of determining current use in a multi-channel device includes calculating a worst case scenario current for a channel of the device and calculating a worst case channel skew for a channel of the device. Based on the worst case scenario current and the worst case channel skew, a switching current (e.g., a maximum switching current) is determined for the device.

In another embodiment, a method of reducing simultaneous switching output noise in a multi-channel device includes determining a first switching current for a plurality of independent input/output (I/O) channels of the device switching simultaneously, and determining an initial delay for switching the channels evenly distributed over a bit period. A second switching current for the plurality of I/O channels switching evenly over a known bit period using a delay of the bit period divided by the number of channels in the plurality of channels is compared with the first switching current. When the second switching current is less than the first switching current, a new second switching current is determined by grouping the plurality of channels into groups using a longer delay. Determining a second switching current, comparing, and determining whether grouping the plurality of channels are repeated until the determined new switching current is greater than a previous new switching current. A layout implementation is performed with the lowest of the determined second switching currents.

In another embodiment, method of reducing simultaneous switching output noise in a multi-channel device includes calculating a worst case scenario current for a channel of a device, setting a counter i at 1, and setting a delay for spreading switching of channels of the device evenly over a bit period using a spacing of i multiplied by the bit period divided by the number of channels in the device, and determining whether a worst case skew for a channel of the device exceeds the initial delay. When the worst case skew does not exceed the delay, a layout implementation is performed to spread the channel switching evenly over the bit period using the delay between each channel switching.

This summary is not intended to describe each disclosed embodiment or every implementation of the techniques for mitigating an impact of simultaneous switching output described herein. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

With growing complexity and size of system on a chip (SoC) devices, the numbers of inputs/outputs (I/Os) on systems and chips are also increasing. For such designs, when a sufficient number of I/Os switch simultaneously, that simultaneous switching output (SSO) results in a large instantaneous change in current across a power rail. Simultaneous switching of multiple I/Os can induce a voltage drop in the chip and package power network. Such a drop temporarily changes the ground potential, which creates SSO noise. This SSO noise can cause unstable operation of the chip.

SSO noise, also referred to as ground bounce, is prevalent especially in high speed multichannel parallel buses having higher data rates, such as flash memory. SSO can cause higher loads on power rails, which results in voltage drop on power rails. Further, a power delivery network (PDN) for a chip with SSO noise may not be able to handle power demands during SSO. This in turn can cause signal integrity and power integrity problems and signal propagation delay. As more parallel synchronous interfaces are used in a design, increased data rates can increase the problems with SSO noise. Such SSO noise can also affect reliability of a chip power network. Reduction of potential SSO noise allows for increased reliability and achieving increased system bandwidth (in one embodiment, a maximum bandwidth).

Embodiments of the present disclosure are drawn to layout based approaches using signal integrity-power integrity (SI-PI) simulation of I/Os to reduce SSO in a multi-channel flash interface design. Embodiments of the present disclosure include methods for reducing SSO impact in a system through the use of signal integrity/power integrity (SI/PI) simulations for each channel of a multichannel flash interface design. Embodiments of the present disclosure analyze current patterns in the power network of a chip to decide whether or how to group flash channels to reduce SSO. This is accomplished in one embodiment by introduction of signal delays and determining a combination of flash channels to switch together. Specifically, embodiments of the disclosure determine a potential current drop on a power rail of a system, and by grouping channels or introducing delay of switching across a predetermined bit period, and by comparing a current impact of various combinations of channels and delays, reduce SSO noise. Embodiments of the present disclosure provide a layout based design implementation approach using SI/PI simulation of I/O to reduce SSO of a multi-channel flash interface design and to thereby reduce a peak switching power for an SSD controller.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third"

elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Figure 1:
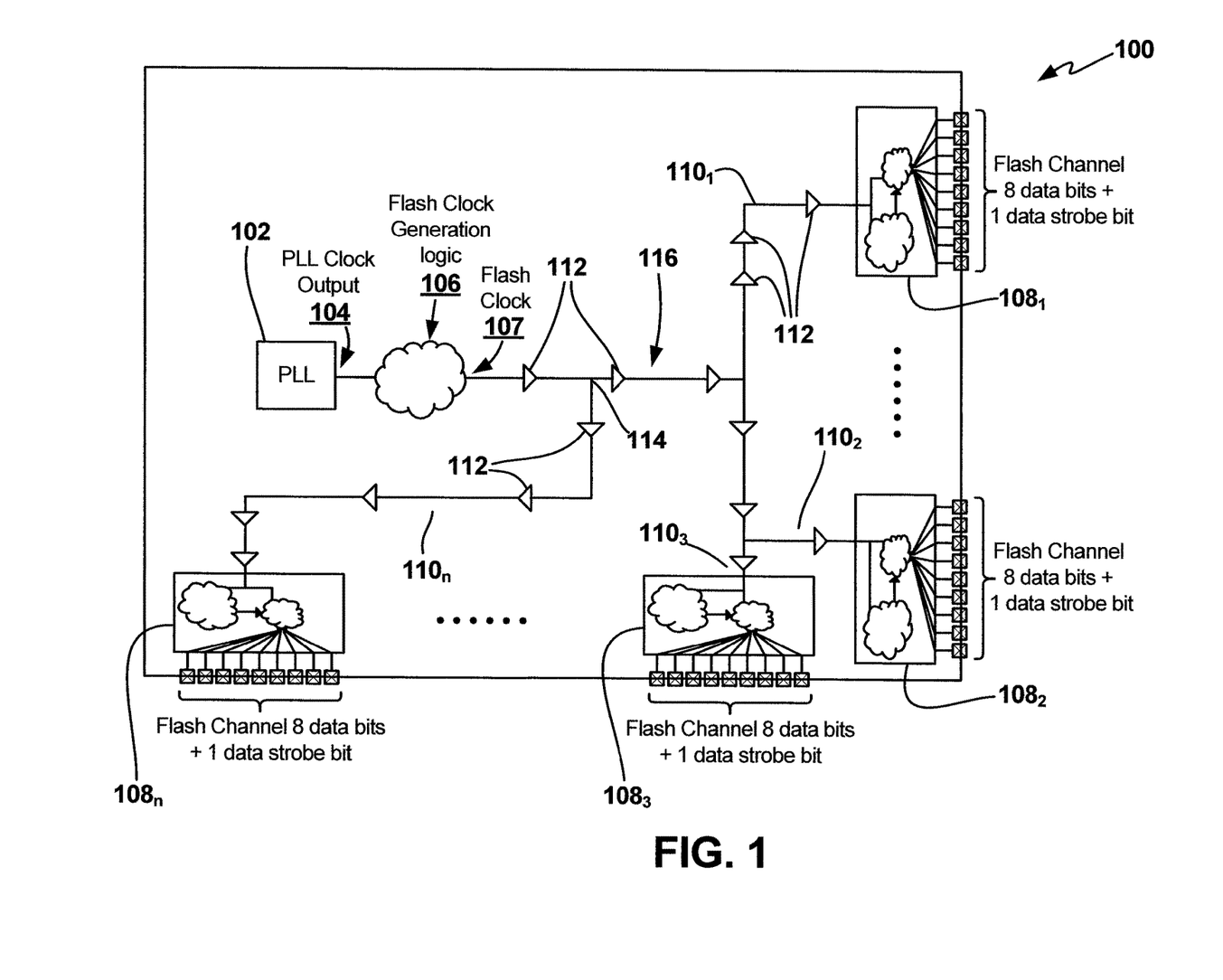
FIG. 1 is a block diagram of a system on which embodiments of the present disclosure may be practiced.

One type of system subject to SSO noise is a device having a multichannel high speed flash interface, such as a SoC controller, a solid state drive, or the like. A block representation of such a device 100 is shown in FIG. 1. Device 100 includes a phase locked loop 102 generating a clock output 104. Flash clock generation logic 106 generates a flash clock signal 107 which provides timing information for operation of a plurality (n) of flash channels $108_1$, $108_2$, $108_3$, ..., $108_n$. Each flash channel 108 operates on its own flash clock tree $110_1$, $110_2$, $110_3$, ..., $110_n$, which comprises a plurality of buffer and/or delay elements 112 that together form a flash clock tree 116 for the device 100. Some of the delay and/or buffer elements 112 are specific to a particular flash clock tree 110, and some of the delay and/or buffer elements 112 are in every flash clock tree 110. The delay and/or buffer elements 112 in every flash clock tree 110 are those elements 112 that are situated between the flash clock generation logic 106 and a first branch 114 to one of the plurality of flash channels 108. All delay and/or buffer elements 112 are external to the flash channels 108. Each flash channel 108 also operates independently. Because of this, there is a possibility of multiple channels switching simultaneously (n*# of I/O bits per channel), hence the potential for causing SSO noise. As the capacity of flash memory increases, the number of flash channels in devices such as device 100 also increases, and the chances for SSO noise also therefore increase.

Because the channels 108 share a common flash clock signal 107, the potential current to be used given the potential for SSO is the amount of current possible for each flash channel 108 multiplied by the number of channels (n). Each flash channel 108 has in one embodiment 8 data bits each on a data pin (DQ) and 1 data strobe bit on a strobe pin (DQS). If a single DQ I/O uses a current $i_{dq}$ during switching, and a DQS I/O uses a current $i_{dqs}$ during switching, then the potential current used by a single flash channel ($I_{channel}$) will be:

$$I_{channel} = (8 \cdot i_{dq}) + i_{dqs} \quad (1)$$

A total potential current ($I_{total}$) for n channels will be:

$$I_{total} = n \cdot I_{channel} \quad (2)$$

Figure 2:
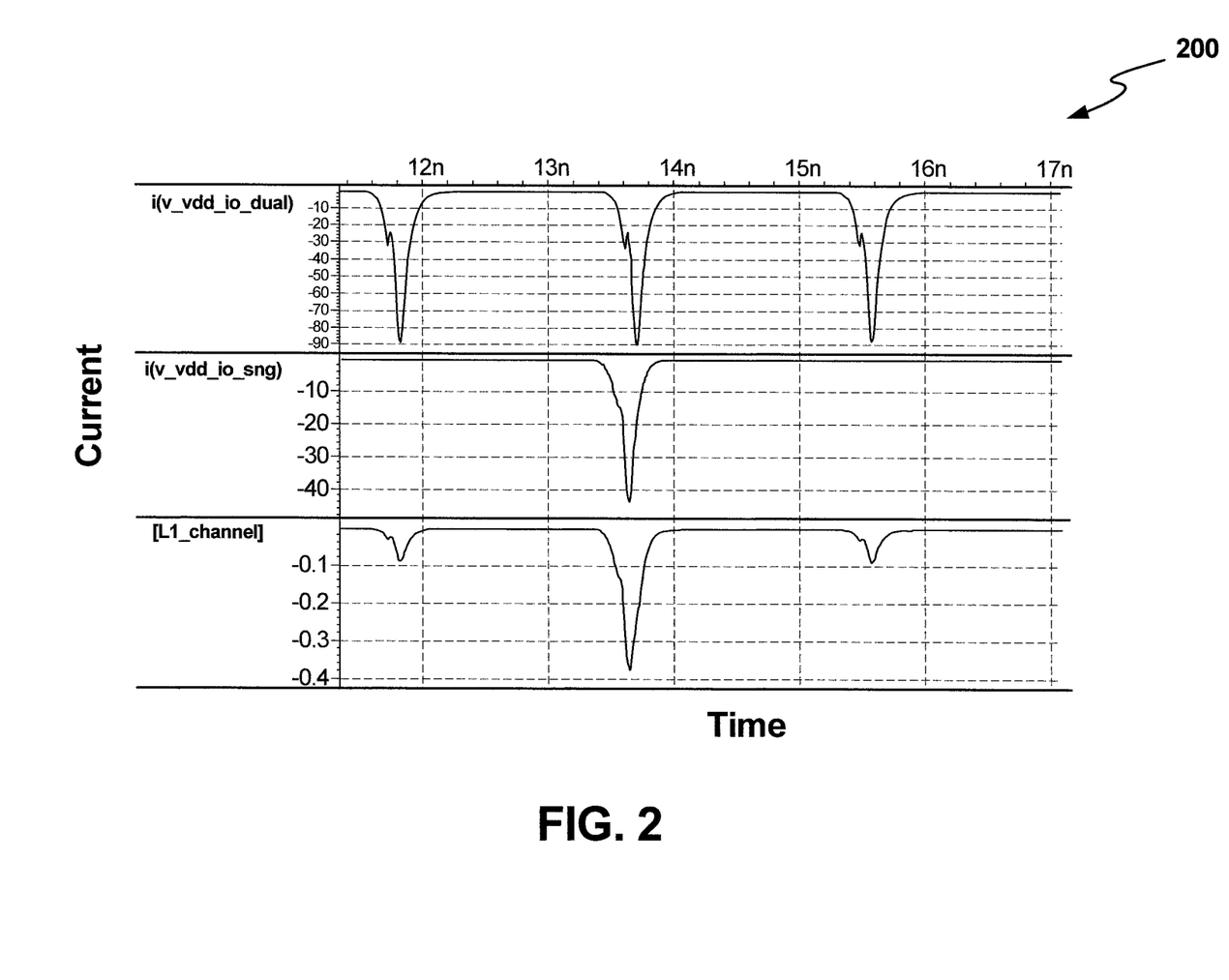
FIG. 2 is a graph showing potential worst case current scenarios for inputs/outputs (I/Os) and a single-channel of the device according to another embodiment of the present disclosure.

FIG. 2 is a graph showing potential worst case current scenarios 200 for an example flash channel 108 as described above, having 8 DQ I/Os and one DQS I/O. In this scenario, a worst current value for a single DQ I/O is presumed to be 47.8 milliAmps (mA), and a worst current value for a DQS I/O is presumed to be 90.1 mA. So, for a single flash channel 108, using these numbers, a maximum potential current ($I_{channelmax}$) drawn by the channel will be:

$$I_{channelmax} = (8 \cdot i_{dq}) + i_{dqs} = 412 \text{ mA} \quad (3)$$

In a system with nine flash channels 108 switching simultaneously, the total current ($I_{totalmax}$) will be:

$$I_{totalmax} = 9 \cdot 412 \text{ mA} = 3.708 \text{ A} \quad (4)$$

With typical power and current available on devices, the $I_{totalmax}$ cannot be reliably supplied instantaneously at any time. In a flash system, each I/O of an individual channel switches at the same time as the other I/Os in the channel. When each flash channel attempts to switch at the same time as the other channels, all the I/Os are switching at the same time. When I/Os switch together, they also use a large amount of current from a chip power supply. A voltage regulator module (VRM) for a chip typically does not have enough capacity to provide that much current instantaneously.

Figure 3:
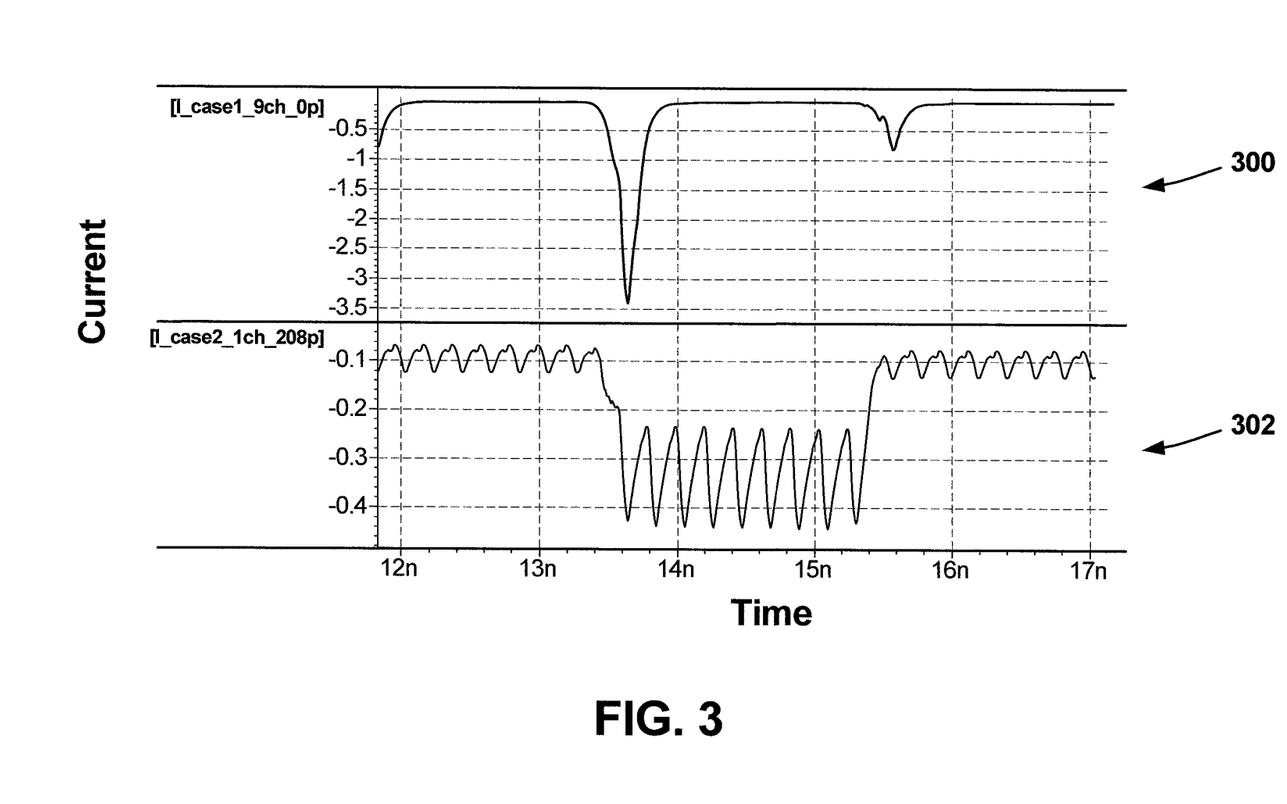
FIG. 3 is a graph showing a comparison between potential worst case current for multi-channel device and current after the application of an embodiment of the present disclosure.
Figure 4:
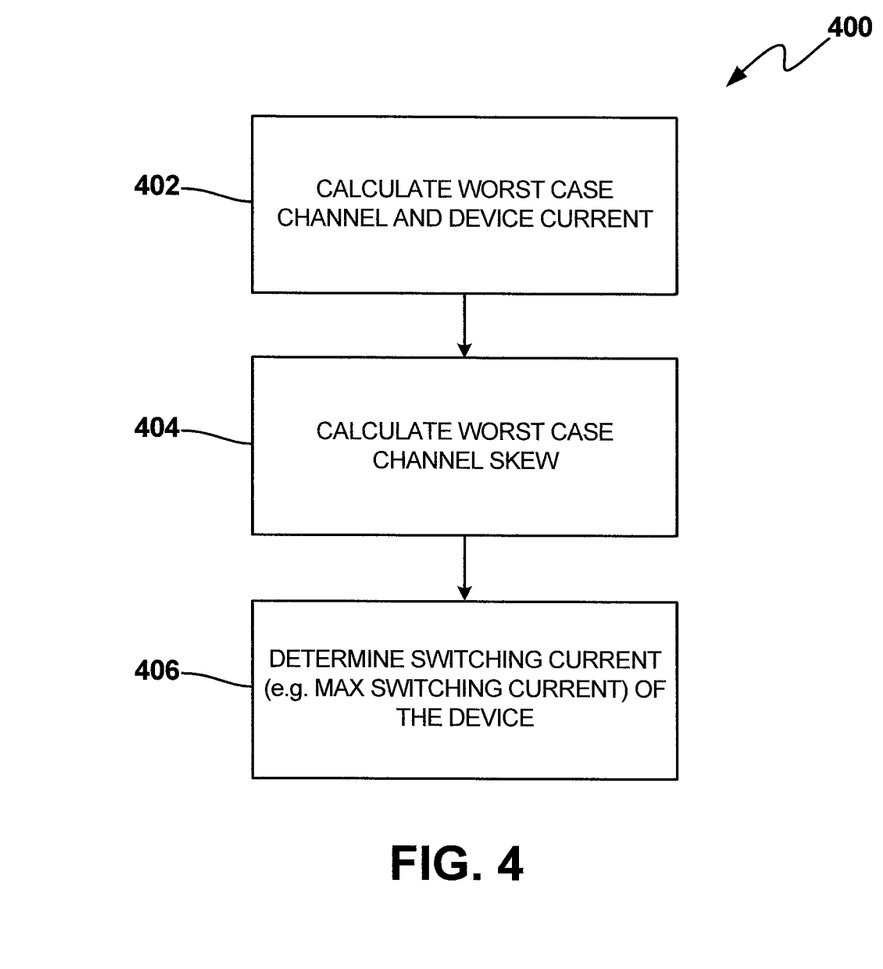
FIG. 4 is a flow chart diagram of a method according to an embodiment of the present disclosure.

FIG. 3 is a graph showing a total current plot 300 for nine representative channels switching simultaneously. The high instantaneous switching current of plot 300 has potential to cause SSO noise. Embodiments of the present disclosure provide methods for controlling simultaneously switching outputs to reduce SSO noise effects. This reduction can also provide a more reliable power network and therefore more reliable data transfer, reduced distortions in data transmission, better output slew rates and better Signal to Noise ratio (SNR). A total current plot 302 for the same nine channels switching evenly over a single bit period is shown also in FIG. 3. This distribution and methods to determine what type of distribution of channel switching assists in SSO noise mitigation are discussed further below with respect to FIGS. 4-6.

Methods of the present disclosure are drawn generally to configuring a layout of a SSD flash controller based on inputs from SI-PI simulations to reduce SSO effects. A method 400 for reduction of SSO noise on a die in a solid state drive (SSD) controller is shown in flow chart form in FIG. 4. Method 400 includes, in one embodiment, calculating a worst case scenario current for a channel of a device subject to SSO in block 402, calculating a worst case channel skew for a channel of the device in block 404, and determining, based on the worst case scenario current and the worst case channel skew, a potential switching current for the device (e.g., a maximum switching current). The worst switching current is determined in one embodiment using at least one of a combination of time delay between switching of channels and groupings of multiple channels per group to reduce current consumption in block 406.

Calculating a worst case scenario for current consumption depends, for example, on ambient conditions (such as process, voltage, temperature), channel details, and the like. In a worst case operating condition, current consumption for a channel will be as high as is likely to be encountered in any real world operation. Current calculation examples have been discussed herein with respect to FIGS. 1-3.

Calculating worst skew for a channel comprises calculating a worst positive skew Wsq+ and a worst negative skew Wsq−. Skew calculation is performed for one channel of a multi-channel device as the channels of such a device are usually identical. Skew within a channel may be due to fast or slow operations of portions of the channel, including by way of example only and not by way of limitation flash interface logic and flash data processing logic.

Figure 5:
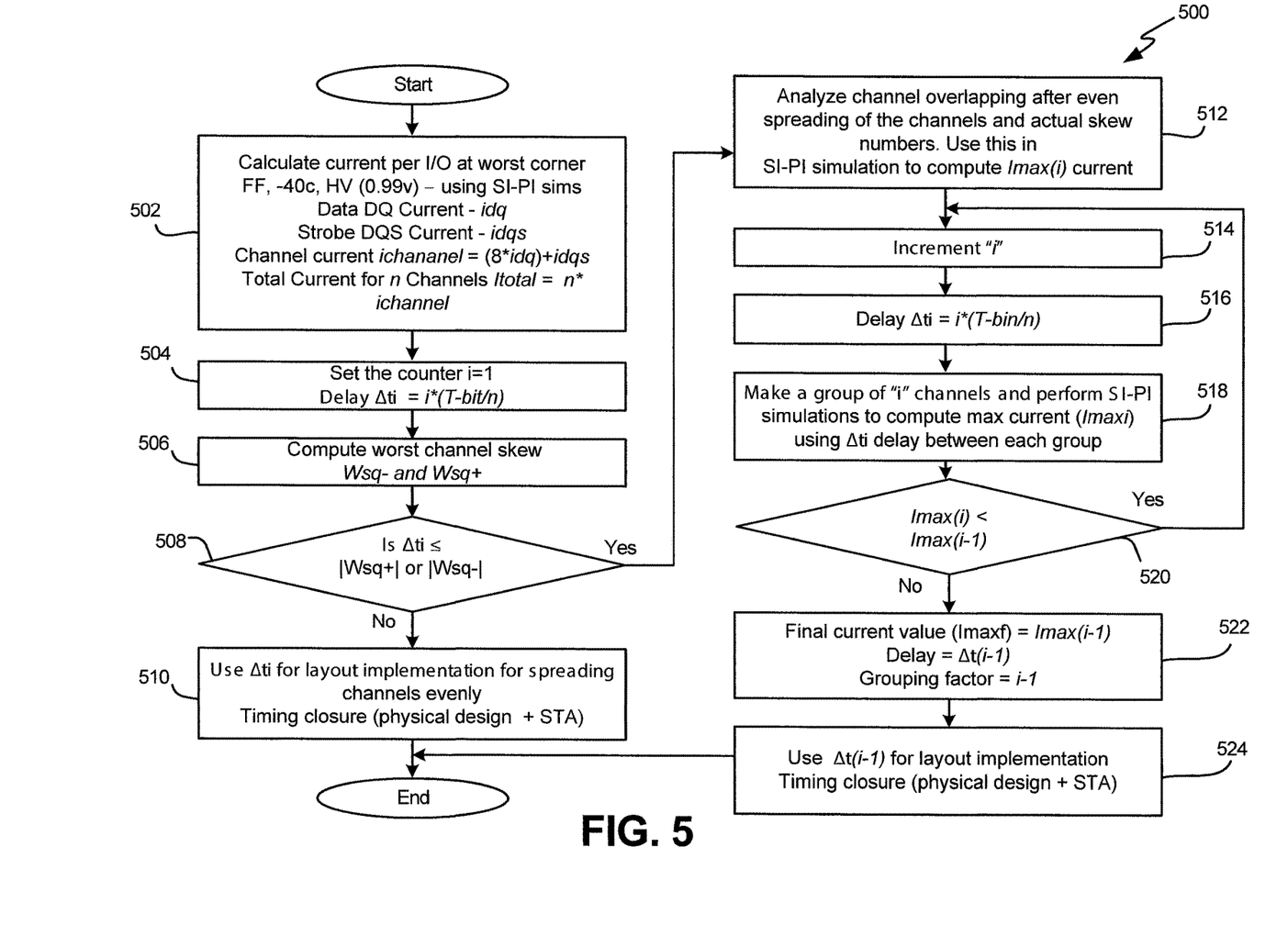
FIG. 5 is a flow chart diagram of a method according to another embodiment of the present disclosure.

A more detailed method 500 for reducing SSO in a device is shown in FIG. 5. Method 500 includes the general method described with respect to FIG. 4, but with further detail. Method 500 includes, in one embodiment, calculating a worst case scenario current for a channel of a device, having n flash channels, subject to SSO in block 502 (also as described with respect to block 402). In block 504, a loop counter i is set at i=1 and an initial delay $\Delta ti$ is set at $\Delta ti=i*(T\text{-bit}/n)$ where T-bit is equal to a bit period for the device.

Worst case channel skews both positive Wsq+ and negative Wsq− are calculated, or alternatively are known or looked up, in block 506 (also as described with respect to block 404). In decision block 508, a comparison is made between the absolute values of Wsq+ and Wsq− and $\Delta ti$ as to whether $\Delta ti \le |Wsq+|$ or $|Wsq-|$. If $\Delta ti$ is greater than both absolute values, the time delay $\Delta ti$ is used in block 510 for layout implementation, with channels of the device switching evenly over a bit period T-bit. Timing closure is made for physical design and static timing analysis for the device, and the process is complete.

If $\Delta ti$ is less than or equal to either of the absolute values of the worst case skews, that indicates that an overlap may be present between switching bits of different channels. Process flow continues at block 512, in which a determination is made as to channel overlap after spreading channel switching evenly over the bit period T-bit. An SI-PI simulation is run to determine a maximum current draw (Imax(i)) for the device with the overlapping channels distributed over the bit period for the current iteration i (i=1 for initial instantiation of block 512) of the process 500. Loop counter i is incremented by one at block 514. A new $\Delta ti$ for the incremented loop counter is determined at block 516, where $\Delta ti=i*(T\text{-bit}/n)$. In block 518, a grouping of channels is made in which the n channels are grouped into groups of i channels. For example, if i=2, groups of two channels are made, with each group of two channels switching together. SI-PI simulation is run again to determine Imax(i) for the incremented i with the current channel grouping.

In decision block 520, the current Imax(i) is compared with the previous Imax(i−1). If Imax(i) is less than Imax(i−1), process flow continues at block 514, and determination of Imax(i) is made as in blocks 514, 516, and 518. If Imax(i) is ≥Imax(i−1), process flow continues at block 522. In block 522, a final Imaxf is set as Imax(i−1). A final time delay $\Delta tf$ is set as $\Delta t(i-1)$, and the n channels of the device are grouped into blocks of (i−1) channels. The final timing delay $\Delta tf$ is used for layout implementation, with a group of (i−1) channels of the device switching evenly over the bit period T-bit, and timing closure is made for physical design and static timing analysis for the device, at block 524, and the process is complete.

Further known techniques for corrections in package and/or board design may be used to further mitigate SSO issues.

For channel groupings, the worst case scenario is all channels switching simultaneously. For a configuration in which $\Delta ti$>worst absolute skew time, that is i=1, each channel switches with a delay of T-bit/n. When $\Delta ti$<worst absolute skew time, for a configuration in which $\Delta tf$ has i=3, the delay is $\Delta t2$ and each group of 2 channels switches with delay of 2*(T-bit)/n. For a configuration in which $\Delta tf$ has i=4, the delay is $\Delta t3$ and each group of 3 channels switches with delay of 3*(T-bit)/n. This continues until each group of n/2 channels switches with delay of T-bit/2.

Alternatively stated, a method of reducing simultaneous switching output noise in a multi-channel device includes calculating a worst case scenario current for a channel of a device, setting a counter i at 1, and setting a delay for spreading switching of channels of the device evenly over a bit period using a spacing of i multiplied by the bit period divided by the number of channels in the device, and determining whether a worst case skew for a channel of the device exceeds the initial delay. When the worst case skew does not exceed the delay, a layout implementation is performed to spread the channel switching evenly over the bit period using the delay between each channel switching. When the worst case skew exceeds the delay, a simulation is performed to determine a maximum current for evenly spreading switching of the channels over the bit period, the counter is increased by one, and new delay of i multiplied by the bit period divided by the number of channels in the device is set. The channels are grouped into groups of i channels per group, and a simulation is performed to determine a new maximum current when switching the groups of channels over the bit period using the new delay between each group of channels switching. The new maximum current is compared to the maximum current, and when the new maximum current is less than the maximum current, the process loops through increasing the counter, grouping the channels, performing a simulation, and comparing the new maximum current with the previous new maximum current until the new maximum current is equal to or greater than the previous new maximum current. Once the new maximum current is equal to or greater than the previous new maximum current, a layout implementation is performed to spread the channel switching over the bit period using a delay of (i−1) multiplied by the bit period divided by the number of channels, and with a grouping of (i−1) channels per group.

An exemplary set of calculations is shown below for a solid state drive having nine channels operating at a speed of 533 megatransfers per second (MTPS). For 533 MTPS, a bit period T-bit is 1/533 MTPS=1876 picoseconds (ps). Using a data pin DQ current of idqmax=47.8 mA and a strobe pin DQS current of idqsmax=90.1 mA, with eight DQ bits and one strobe bit, total ichannel=412 mA. For nine channels, total current for the SSD is Itotal=9*ichannel=3.708 A. With i=1, the initial delay $\Delta t1$ is 1876 ps/9=208 ps. Channel skew is determined using known techniques.

Presuming $\Delta t1$ is less than or equal to either positive or negative skew absolute values, an SI-PI simulation is run with even distribution of channels with delay 208 ps over the T-bit of 1876 ps is run with actual skew numbers to determine the maximum current generated by the overlapping grouping as described in block 512. In the example, the even distribution of channels over the T-bit with actual skew is determined in simulation to have Imax1=481 mA. This 481 mA is less than the worst case scenario of 3.708 A. Loop counter i is set to 2 and $\Delta t2=2*(1876 \text{ ps}/9)=416$ ps. The nine channels are grouped into groups of 2, for example channels 0 and 1, channels 2 and 3, channels 4 and 5, channels 6 and 7, and channel 8 alone. SI-PI is run to compute maximum current Imax2=824 mA. Imax2 is greater than Imax1 so Imaxf=Imax1, $\Delta tf=\Delta t1$, and channels are arranged into groups of 1 for final layout and timing closure.

If Imax2 had been less than Imax1, a new i=3 would be used to calculate $\Delta t3=624$ ps and channels are grouped into groups of 3, and so on, until Imaxi>Imax(i−1). In situations in which the bit period T-bit is short or the number of channels n is very large, overlaps can be complicated, and result in situations in which larger groupings of channels will use the lowest amount of current during switching.

Figure 6:
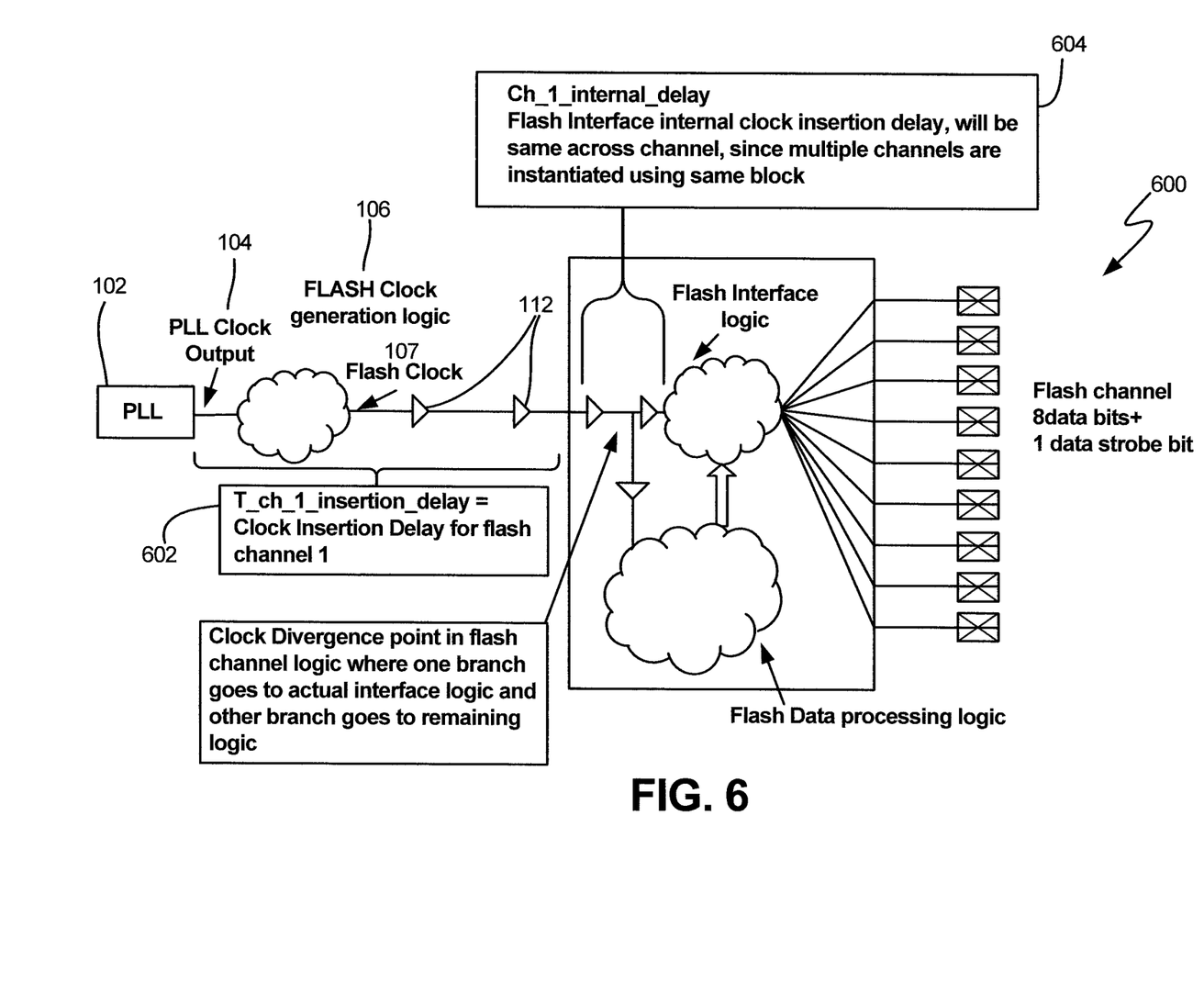
FIG. 6 is a block diagram of a portion of a system on which embodiments of the present disclosure may be practiced.

Once a final time delay $\Delta t$ is determined, layout implementation proceeds. FIG. 6 illustrates a block diagram of a single flash channel 108 and its relation to the flash logic and timing implementation 102, 104, 106, 112, 116. A clock insertion delay is determined for each channel. Each clock insertion delay for flash channel logic comprises two components:

i. Clock insertion delay at the input of the channel (for channel 1, as shown in FIG. 6, this is T_ch_1_insertion_delay 602)

ii. Clock insertion from input of the channel to actual flash interface logic (for channel 1, as shown in FIG. 6, this is ch_1_internal_delay 604)

Since all channels of a device typically have the same flash interface block 108, the second component is constant across all channels of the device. The first component differs for each channel. Each channel therefore has its own insertion delay:

T_ch_1_insertion_delay=Clock insertion delay for channel 1

T_ch_2_insertion_delay=Clock insertion delay for channel 2

T_ch_3_insertion_delay=Clock insertion delay for channel 3

. . .

T_ch_n_insertion_delay=Clock insertion delay for channel n

When the channels are grouped as a single channel per group and spread out over a single bit period, the insertion delays differ. When channels are grouped in more than one channel per group, insertion delays for those groups will be the same.

In an example in which the channel switching is spread evenly over a single bit period, the insertion delays, folded over single bit period, will be less than the flash interface bit period. Based on the inputs from SI-PI simulations, the channel groups (of i–1 channels from the method 500) have adjusted insertion delays such that difference between the flash channel groupings is Δtf. For the case where all the channels are distributed singly and evenly over a bit period, each channel is segregated separately. The desired delay is achieved by inserting inverters and/or buffers in the particular flash clock tree 110 external to each flash channel.

Actual insertion delay timing when channels are grouped, or when there is overlap of switching, may extend beyond a single bit period. Therefore, the actual insertion delay of each channel is rolled in one embodiment over a single clock period (T-bit) of the flash clock 107. To do this, the actual insertion delay of each channel is divided by the clock period (T-bit), and the folded insertion delay is the remainder of that division:

Remainder of (T_ch_1_insertion_delay/T_Bit)= T_ch_1_insertion_delay_folded

Remainder of (T_ch_2_insertion_delay/T_Bit)= T_ch_2_insertion_delay_folded

. . .

Remainder of (T_ch_n_insertion_delay/T_Bit)= T_ch_n_insertion_delay_folded

As a practical example, if the actual insertion delay for channel 5 is greater than the bit period, for example, it is 2376 ps, the remainder of a division of the actual insertion delay divided by the bit period is 2376 ps/1876 ps is 500 ps. This is the T_ch_5_insertion_delay_folded. This delay is implemented as described herein, by the insertion of delay elements and/or buffers in the flash clock tree 116.

Figure 7:
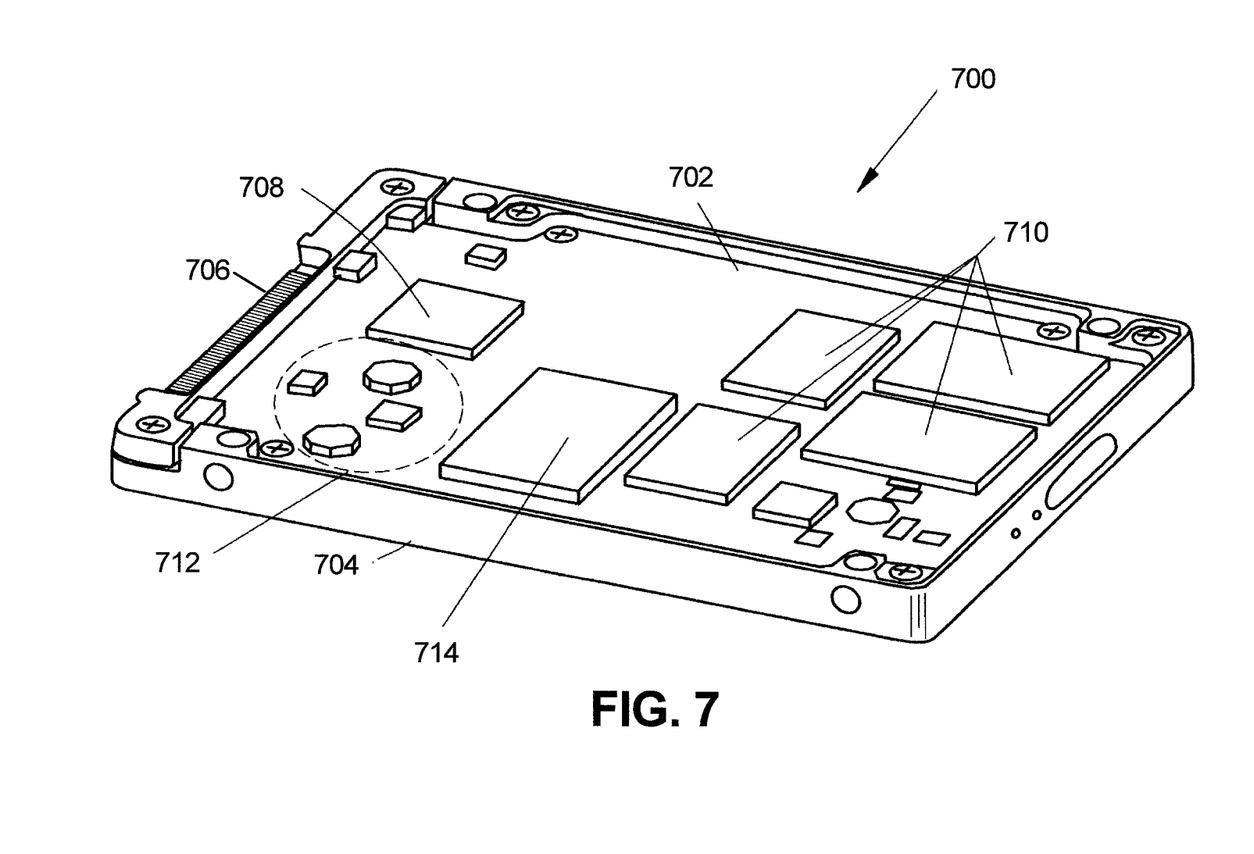
FIG. 7 is an oblique view of a solid state drive (SSD) on which embodiments of the present disclosure may be used.

Referring now to FIG. 7 illustrates an oblique view of a solid state drive (SSD) 700 in accordance with another embodiment on which chips or systems embodying the methods and layouts described herein may be used. SSD 700 includes one or more printed circuit boards (PCBs) or circuit card assemblies 702 and typically includes a protective, supportive housing 704, and one or more interface connectors 706. SSD 700 further includes a controller application specific integrated circuit (ASIC) 708, one or more non-volatile memory devices 710, and power regulation circuitry 712. The memory devices 710 are essentially the SSD's data storage media. SSD 700 may include erasure blocks as the physical storage locations within memory device 710, which may include Flash memory devices, for example. In some applications, SSD 700 further includes a power-backup energy storage device, such as a super-capacitor 714.

In accordance with certain aspects, the SSD 700 includes the circuit card assembly 702 that includes a connector 706 for connection to a host computer (not shown). In accordance with certain aspects, the connector 706 includes a NVMe (non-volatile memory express), SCSI (small computer system interface), SAS (serial attached SCSI), FC-AL (fiber channel arbitrated loop), PCI-E (peripheral component interconnect express), IDE (integrated drive electronics), AT (advanced technology), ATA (advanced technology attachment), SATA (serial advanced technology attachment), IEEE (institute of electrical and electronics engineers)-1394, USB (universal serial bus) or other interface connector adapted for connection to a host computer. Layout validation and timing for SSO noise mitigation for the system 700 and/or its SSD or flash controller (such as controller 708) may be performed and layout design and implementation may be performed according to the methods described herein.

Advantages of the embodiments of the present disclosure include the reduction of SSO noise on an actual die using cost effective methods. Further, as actual die layouts are used, true I/O currents and timing are considered. When SSO noise is mitigated, this results in less stress on chips in actual use, and therefore mean time before failure increases.

Accordingly, embodiments of the present disclosure provide, during a layout phase of design, a layout that takes into account SSO noise mitigation by determining time delays, insertion delays, and grouping of channels. Current patterns for each channel are analyzed in various embodiments through SI-PI simulations. Channels are grouped based on current drawing patterns to avoid SSO. SI-PI simulation data is further used to decide whether to group channels or not. If channels are to be grouped, the grouping combinations are determined which reduce SSO.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and therefore are not drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of determining current use in a multi-channel device, comprising:
    calculating a worst case scenario current for a channel of the device using signal integrity-power integrity (SI-PI) simulation;
    calculating a worst case channel skew for the channel of the device;
    determining, based on the worst case scenario current and the worst case channel skew, a switching pattern for channels of the device;
    setting a delay for spreading switching of channels of the device evenly over a bit period using a spacing of i multiplied by the bit period divided by a number of channels in the device;
    determining whether the worst case skew for a channel of the device exceeds the delay;
    when the worst case skew exceeds the delay, iteratively incrementing by one a number of channels in a group, updating the delay between channel groups, and analyzing channel overlap and using SI-PI simulation to determine a new worst case current based on the updated delay, until the new worst case current for the current iteration is not less than the worst case current for the prior iteration.

2. The method of claim 1, wherein calculating a worst case scenario current for a channel is based on expected worst case operating conditions of the device.

3. The method of claim 1, wherein calculating a worst case channel skew comprises calculating a worst positive skew and a worst negative skew for the channel.

4. The method of claim 1, and further comprising performing a layout implementation to spread the channel switching over a bit period using the determined switching pattern.

5. A method of reducing simultaneous switching output (SSO) noise in a multi-channel device, comprising:
    setting a counter i at 1;
    calculating a worst case scenario current for a channel of the device using signal integrity-power integrity (SI-PI) simulation;
    setting a delay for spreading switching of channels of the device evenly over a bit period using a spacing of i multiplied by the bit period divided by a number of channels in the device;
    determining whether a worst case skew for a channel of the device exceeds the delay;
    when the worst case skew does not exceed the delay, performing a layout implementation to spread the channel switching evenly over the bit period using the delay between each channel switching; and
    when the worst case skew exceeds the delay:
        performing an SI-PI simulation to determine a maximum current for evenly spreading switching of the channels over the bit period;
        increasing the counter by one, and setting a new delay of i multiplied by the hit period divided by the number of channels in the device;
        grouping the channels into groups of i channels per group,
        performing an SI-PI simulation to determine a new maximum current when switching the groups of channels over the bit period using the new delay between each group of channels switching;
    comparing the new maximum current with the maximum current;
    when the new maximum current is less than the maximum current, repeating increasing the counter, grouping the channels, performing a simulation, and comparing the new maximum current with the previous new maximum current until the new maximum current is equal to or greater than the previous new maximum current.

6. The method of claim 5, and further comprising performing a layout implementation to spread the channel switching over the bit period using a delay of (i−1) multiplied by the bit period divided by the number of channels, and with a grouping of (i−1) channels per group.

7. The method of claim 5, wherein setting the delay comprises setting the delay to switch channels of the device evenly over the bit period.

8. The method of claim 5, wherein determining a worst case skew comprises determining a worst case potential positive skew and a worst case potential negative skew, and wherein a worst case skew is determined to be a highest absolute value of the worst case positive and worst case negative skews.

9. A method of reducing simultaneous switching output noise in a multi-channel device, comprising:
    determining, using signal integrity-power integrity (SI-PI) simulation, a first switching current for a plurality of independent input/output (I/O) channels of the device switching simultaneously;
    determining an initial delay for switching the channels evenly distributed over a bit period;
    determining, using SI-PI simulation, whether a second switching current for the plurality of I/O channels switching evenly over a known bit period using a delay of the bit period divided by the number of channels in the plurality of channels is less than the first switching current;
    when the second switching current is less than the first switching current, determining, using SI-PI simulation, a new second switching current by grouping the plurality of channels into groups using a longer delay;
    repeating determining a second switching current, comparing, and determining whether grouping the plurality of channels until the determined new switching current is greater than a previous new switching current.

10. The method of claim 9, and further comprising performing a layout implementation with the lowest of the determined second switching currents.

11. The method of claim 9, wherein determining the total channel current comprises determining the channel current at a worst case condition.

* * * * *